(12) United States Patent
Seki et al.

(10) Patent No.: US 6,734,513 B2
(45) Date of Patent: May 11, 2004

(54) SEMICONDUCTOR DEVICE AND MICRORELAY

(75) Inventors: Tomonori Seki, Kyoto (JP); Tomonari Kogure, Kyoto (JP)

(73) Assignee: Omron Corporation (JP)

( * ) Notice: Subject to any disclaimer, the term of this patent is extended or adjusted under 35 U.S.C. 154(b) by 0 days.

(21) Appl. No.: 09/999,250

(22) Filed: Nov. 1, 2001

(65) Prior Publication Data

US 2002/0100919 A1 Aug. 1, 2002

(51) Int. Cl.[7] .............................................. H01L 43/00
(52) U.S. Cl. ...................... 257/422; 257/200; 257/414; 257/421; 438/97; 438/719; 438/733; 335/2; 335/79
(58) Field of Search ................................ 257/200, 414, 257/421, 422, 415, 685; 438/97, 719, 733, 795; 335/2, 79

(56) References Cited

U.S. PATENT DOCUMENTS

| | | | | |
|---|---|---|---|---|
| 5,398,011 A | * | 3/1995 | Kimura et al. | ................. 335/79 |
| 6,084,281 A | * | 7/2000 | Fullin et al. | ................. 257/422 |
| 6,262,463 B1 | * | 7/2001 | Miu et al. | .................... 257/414 |
| 2002/0163408 A1 | * | 11/2002 | Fujii et al. | ..................... 335/2 |

\* cited by examiner

*Primary Examiner*—David Nelms
*Assistant Examiner*—Dao H. Nguyen
(74) *Attorney, Agent, or Firm*—Rosenthal & Osha L.L.P.

(57) ABSTRACT

In one embodiment, a semiconductor device having single or multi-layer intermediate layers that easily adhere to a glass frit and lead lines of respective interconnections is disclosed. In general, the single or multi-layer intermediate layers are formed on at least the top surfaces of portions of the respective lead lines on which the glass frit is placed.

13 Claims, 16 Drawing Sheets

SEMICONDUCTOR DEVICE AND MICRORELAY

BACKGROUND OF INVENTION

1. Field of the Invention

The present invention relates to a semiconductor element formed on the top surface of a base wafer. In particular, the invention relates to a semiconductor device that is hermetically sealed by bonding a cap wafer to the top surface of a base wafer so that the cap wafer and the base wafer are integrated with each other.

A semiconductor device is known in which a semiconductor element is sealed in hermetically by bonding a cap wafer to the top surface of a base wafer on which the semiconductor element and interconnections are formed with an annular glass frit interposed in between so that the cap wafer and the base wafer are integrated with each other. On the other hand, where the semiconductor element is a microrelay, for example, the resistivity of the interconnections needs to be kept low in a stable manner. To this end, it is desired that the interconnections be made of a hard-to-oxidize noble metal such as gold or platinum.

However, where the interconnections are made of a noble metal such as gold or platinum, the bonding strength is low in regions where lead lines of the interconnections cross the glass frit. That is, there exists a problem that it is difficult to hermetically seal in the semiconductor element.

SUMMARY OF INVENTION

An object of the present invention is to provide a semiconductor hermetic sealing structure capable of hermetically sealing in a semiconductor element formed on a base wafer by bonding a cap wafer to the base wafer with a glass frit interposed in between even in the case where interconnections made of a hard-to-oxidize material such as gold are formed on the base wafer.

To attain the above object, the invention provides a semiconductor device comprising a base wafer; a semiconductor element and interconnections formed on a top surface of the base wafer, the interconnections having respective lead lines; a glass frit; a cap wafer bonded to the top surface of the base wafer with the glass frit interposed in between so that the cap wafer and the base wafer are integrated with each other and the semiconductor element is sealed in hermetically; single or multi-layer intermediate layers formed on at least top surfaces of portions of the respective lead lines on which the glass frit is placed, the intermediate layers having a property of easily adhering to the glass frit and the lead lines.

In this semiconductor device, the glass frit strongly adheres to the lead lines of the respective interconnections with the intermediate layer interposed in between. This makes it possible to hermetically seal in the semiconductor element using the cap wafer.

Each of the lead lines may have a cross-section having a gentle top outline with no edge. With this configuration, each intermediate layer can entirely cover the associated lead line even if the intermediate layers are thinner than the lead lines.

The intermediate layers may be thicker or wider than the lead lines. With this configuration, since the lead lines are not exposed in the regions where the intermediate layers are formed, the hermetic sealing becomes even closer to the complete one.

The intermediate layers may be formed on only top surfaces of the respective lead lines. With this configuration, where the interconnections are thin, desired hermetic sealing can be attained by the intermediate layers formed by using a minimum amount of material.

The intermediate layers may be made of one of silver, copper, palladium, rhodium, nickel, cobalt, ruthenium, tungsten, molybdenum, titanium, and chromium. With this configuration, since the intermediate layers are hard to react with the interconnection material at a heating temperature of the joining process with the glass frit, the wiring resistance can be made stable.

At least a portion of each of the intermediate layers that is in contact with the glass frit may be made of an insulating material including one of silicon oxide, aluminum oxide, silicon nitride, and aluminum nitride. With this configuration, the insulating film intermediate layers further increase the bonding strength.

The intermediate layers may be ones that have been subjected to oxidation. This configuration further increases the bonding strength.

The semiconductor element may be a movable element of a microrelay. This configuration provides a microrelay that is less prone to external influences.

Contacts of the microrelay may be made of the same material as the interconnections. This configuration provides a microrelay that can be manufactured by a smaller number of manufacturing steps because the contacts and the interconnections can be produced in the same step.

The invention also provides a manufacturing method of a semiconductor device in which a semiconductor element is sealed in hermetically by bonding a cap wafer to a top surface of a base wafer on which the semiconductor element and interconnections are formed with a glass frit interposed in between so that the cap wafer and the base wafer are integrated with each other, comprising the step of forming single or multi-layer intermediate layers on at least top surfaces of portions of lead lines of the respective interconnections on which the glass frit is to be placed, the intermediate layers having a property of easily adhering to the glass frit and the lead lines.

The invention also provides a microrelay comprising a base wafer; a movable element of the microrelay and interconnections formed on a top surface of the base wafer, the interconnections having respective lead lines; a glass frit; a cap wafer bonded to the top surface of the base wafer with the glass frit interposed in between so that the cap wafer and the base wafer are integrated with each other and the movable element is sealed in hermetically; single or multi-layer intermediate layers formed on at least top surfaces of portions of the respective lead lines on which the glass frit is placed, the intermediate layers having a property of easily adhering to the glass frit and the lead lines.

In this microrelay, the glass frit strongly adheres to the lead lines of the respective interconnections with the intermediate layer interposed in between. This makes it possible to provide a microrelay that is less prone to external influences by virtue of complete hermetic sealing.

The invention further provides a manufacturing method of a microrelay in which a movable element of the microrelay is sealed in hermetically by bonding a cap wafer to a top surface of a base wafer on which the movable element and interconnections are formed with a glass frit interposed in between so that the cap wafer and the base wafer are integrated with each other, comprising the step of forming single or multi-layer intermediate layers on at least top surfaces of portions of lead lines of the respective interconnections on which the glass frit is to be placed, the intermediate layers having a property of easily adhering to the glass frit and the lead lines.

DETAILED DESCRIPTION

A microrelay hermetic sealing structure according to an embodiment of the invention will be hereinafter described with reference to FIGS. 1–16. As shown in FIGS. 1–4, a microrelay according to the embodiment has a base wafer 10 made of an insulating material such as Pyrex glass, an annular glass frit 30, and a cap wafer 40 made of an insulating material such as Pyrex glass.

Figure 1:
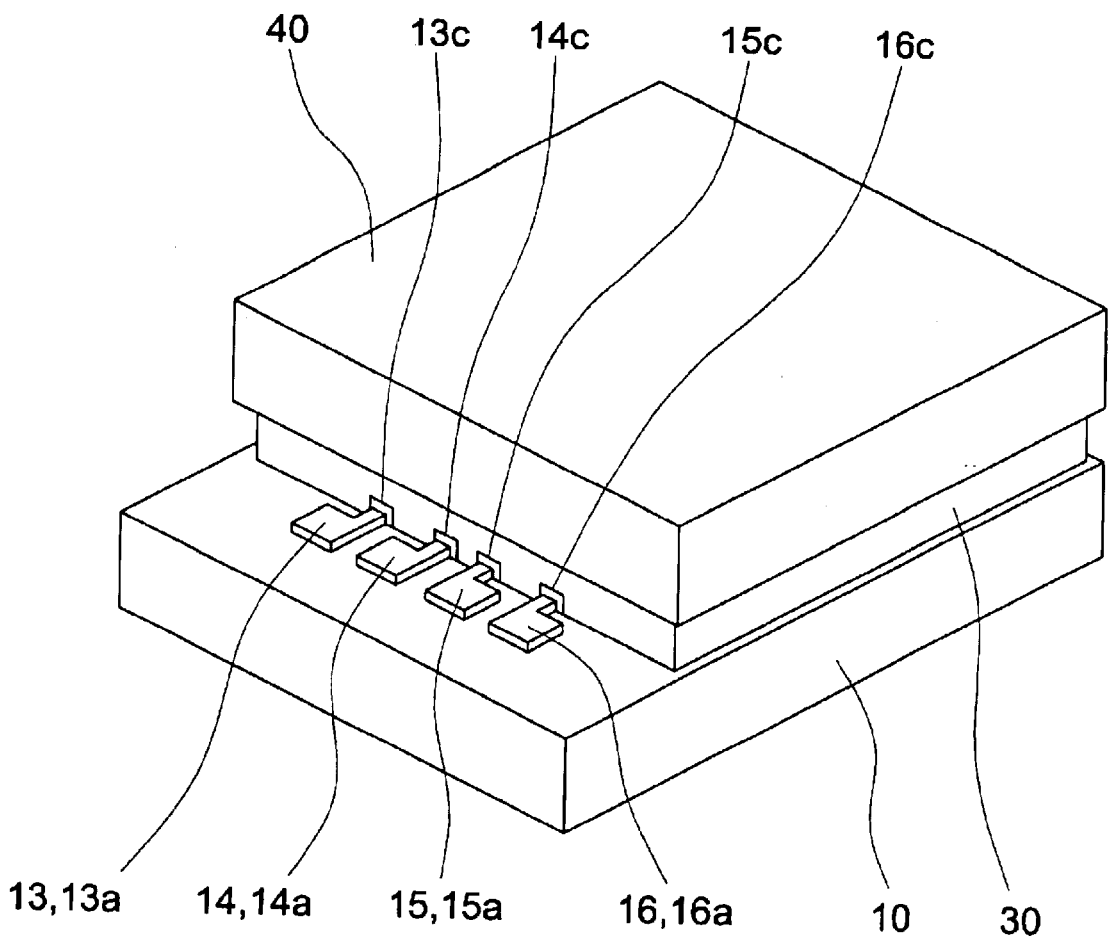
FIG. 1 is a perspective view showing a microrelay according to an embodiment of the present invention.
Figure 2:
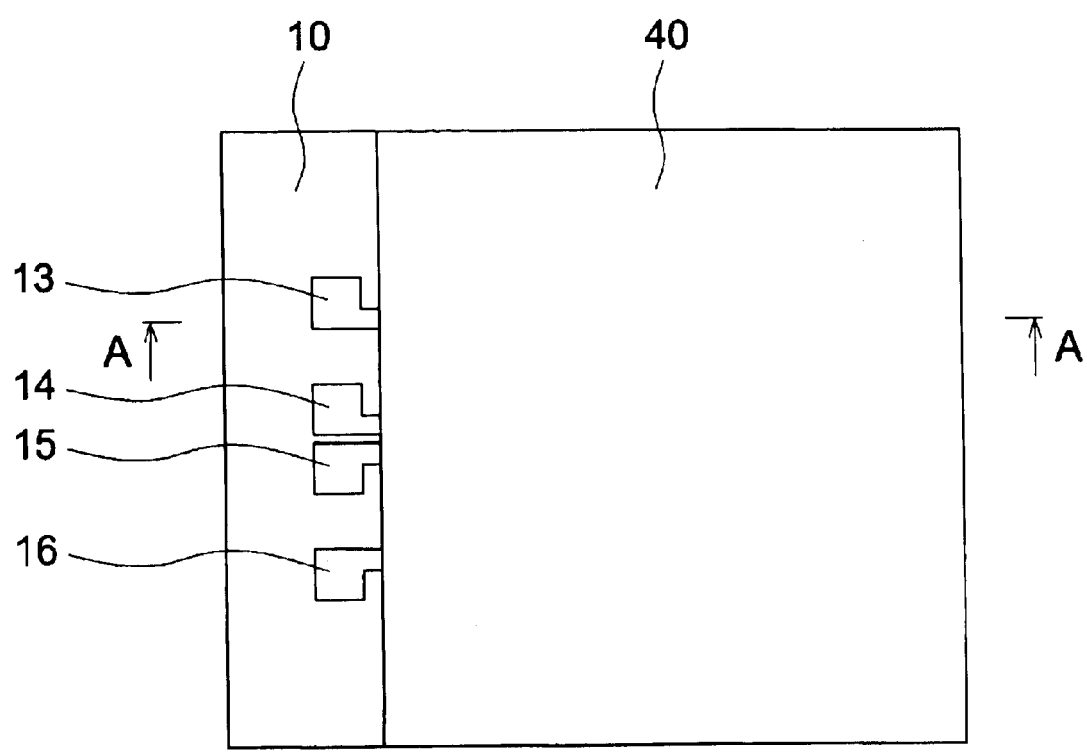
FIG. 2 is a plan view of the microrelay of FIG. 1.
Figure 3:
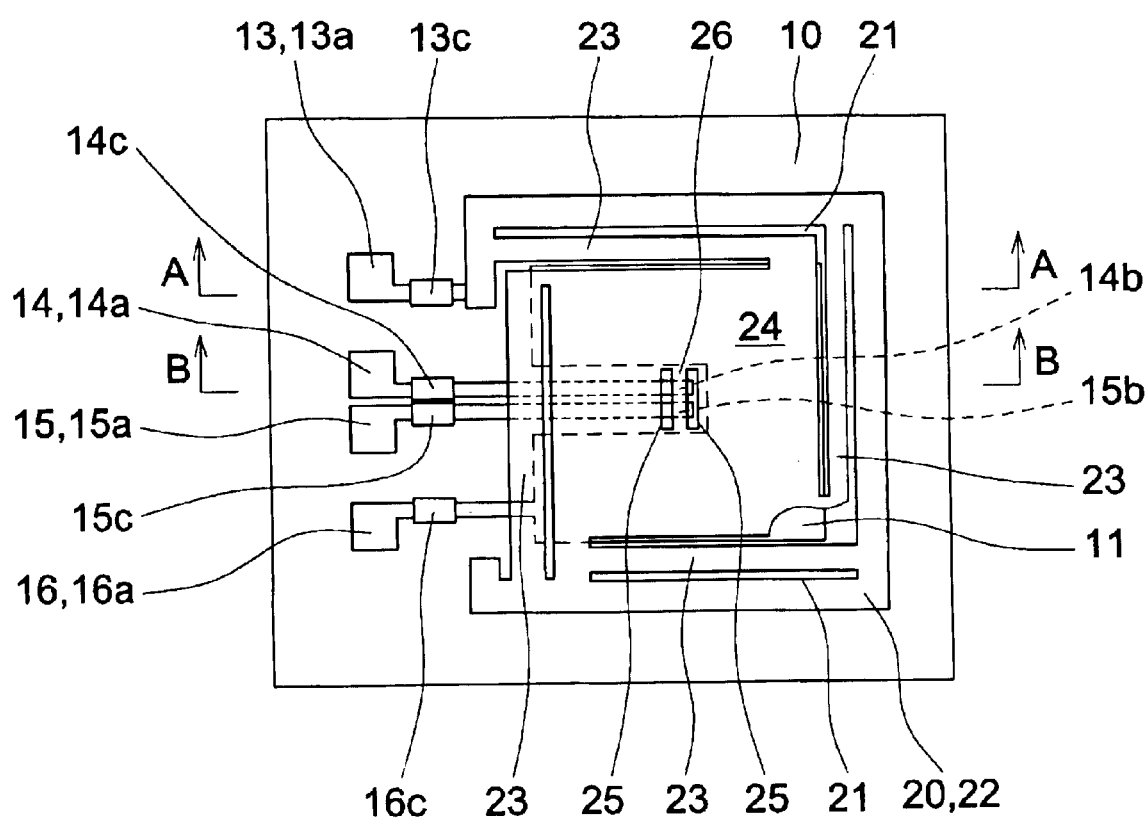
FIG. 3 is a plan view of the microrelay of FIG. 1 with a cap wafer removed.
Figure 4:
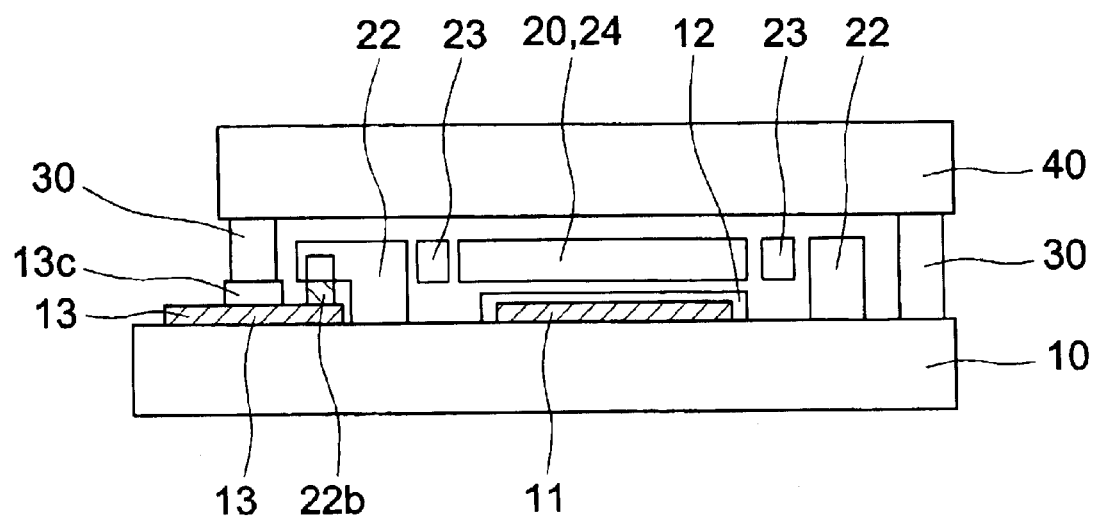
FIG. 4 is a sectional view taken along line A—A in FIG. 2.
Figure 5:
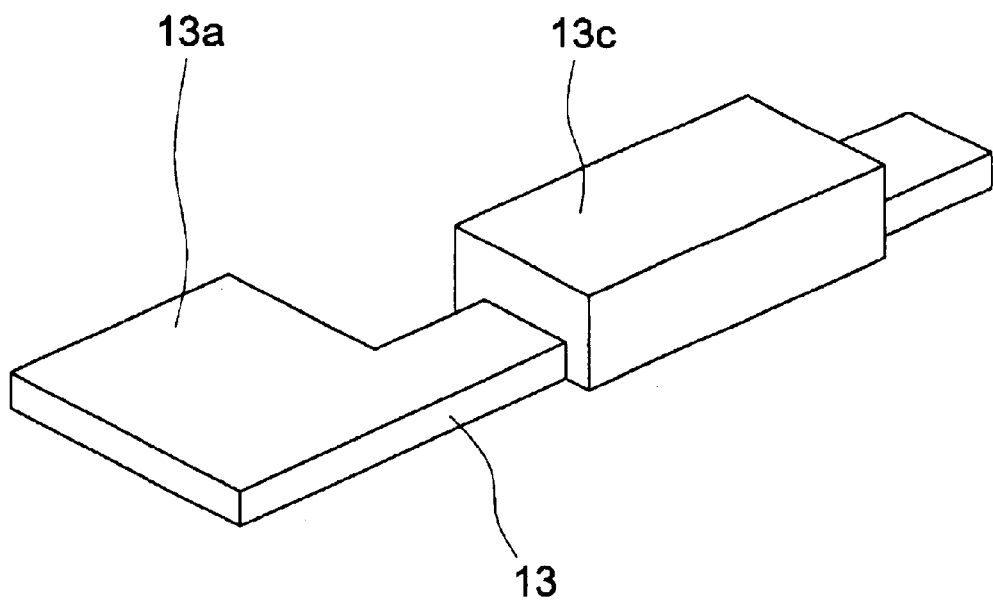
FIG. 5 is a perspective view of an interconnection 13 and an intermediate layer 13c.

As shown in FIG. 3, a fixed electrode 11, four interconnections 13–16, and a movable element 20 are provided on the top surface of the base wafer 10. The fixed electrode 11 is formed at the center on the top surface of the base wafer 10 so as to be planar and generally assume a π-shape, and is covered with an insulating film 12 (see FIG. 4). Among the four interconnections 13–16, one end portions of the two interconnections 14 and 15 are made connection pads 14a and 15a and the other end portions extend to the center of the fixed electrode 11 to form fixed contacts 14b and 15b there. One end portion of the interconnection 16 is made a connection pad 16a and the other end portion is connected to the fixed electrode 11. One end portion of the interconnection 13 is made a connection pad 13a and the other end portion is electrically connected to the movable element 20. The interconnections 13–16 have respective intermediate layers 13c (see FIG. 5), 14c, 15c, and 16c in regions that are in the vicinity of the respective connection pads 13a–16a and where the interconnections 13–16 cross the glass frit 30.

Figure 6A:
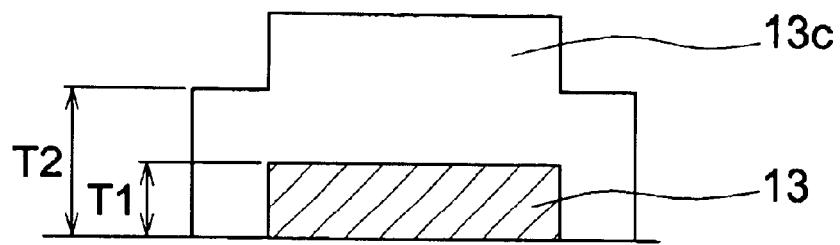
FIGS. 6A–6D are sectional views showing various shapes of the interconnection 13 and the intermediate layer 13c.

The shapes of the intermediate layers 13c–16c can be determined properly in accordance with the sectional shapes of the interconnections 13–16. For example, as shown in FIG. 6A, a step-like intermediate layer 13c may be formed that has a thickness dimension T2 that is greater than a height dimension T1 of the interconnection 13. The shape of the intermediate layer 13c is not limited to the step-like shape and the only requirement is that the intermediate layer 13c be wider than the interconnection 13. The formation of the intermediate layer 13c provides an advantage that the interconnection 13 is not exposed at all there and hence the hermetic sealing becomes even closer to the complete one.

Figure 6B:
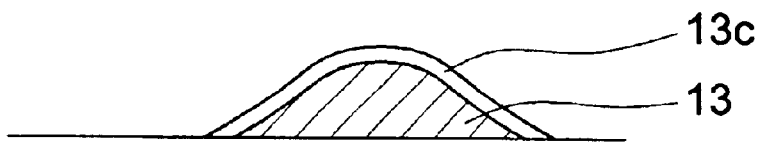
Figure 6C:
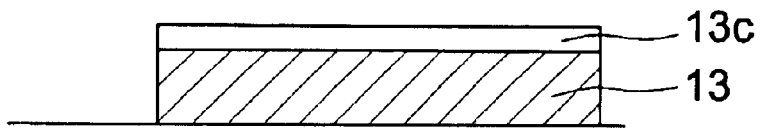

As shown in FIG. 6B, where the interconnection 13 assumes a mountain-like cross-section whose top outline is gentle and has no edge, the intermediate layer 13c may be so formed that its surface becomes parallel with the surface of the interconnection 13. This modification provides an advantage that a thin intermediate layer 13c can cover the interconnection 13. As shown in FIG. 6C, where the interconnection 13 has a rectangular cross-section, the intermediate layer 13c may be formed only on its top surface. In particular, where the interconnection 13 is a thin film of 10 $\mu$m or less in thickness or the thickness of the interconnection 13 is smaller than its width, hermetic sealing that is sufficient for practical use can be obtained by forming the intermediate layer 13c only on the top surface of the interconnection 13. This modification provides an advantage that hermetic sealing can be attained by the intermediate layer 13c formed by using a minimum amount of material. Where the interconnection 13 and the intermediate layer 13c are formed by a film forming process such as evaporation or sputtering, the structure of FIG. 5 in which the intermediate layer 13c also covers the side surfaces of the interconnection 13 requires a step of forming the intermediate layer 13c after forming an original film of the interconnection 13 and shaping it into a desired shape. In contrast, in the structure of FIG. 6C in which the intermediate layer 13c is formed only on the top surface of the interconnection 13, original films of the interconnection 13 and the intermediate layer 13c are formed sequentially and shaped into a desired shape in a single film forming step. This provides an advantage that the film forming step can be simplified.

Where the interconnections 13–16 are made of gold or platinum or an alloy thereof, examples of the material of the intermediate layers 13C–16C are silver, copper, palladium, rhodium, nickel, cobalt, ruthenium, tungsten, molybdenum, titanium, and chromium. In particular, having very high melting points, rhodium, ruthenium, tungsten, and molybdenum are very low in the probability of melting and hence never pollute the hermetically sealed space. Further, where the interconnections 13–16 are made of gold or platinum or an alloy thereof, the intermediate layers 13C–16C may be formed with silver, ruthenium, tungsten, or the like that easily sticks to gold or the like and their surfaces may be subjected to oxidation to increase the bonding strength.

Figure 6D:
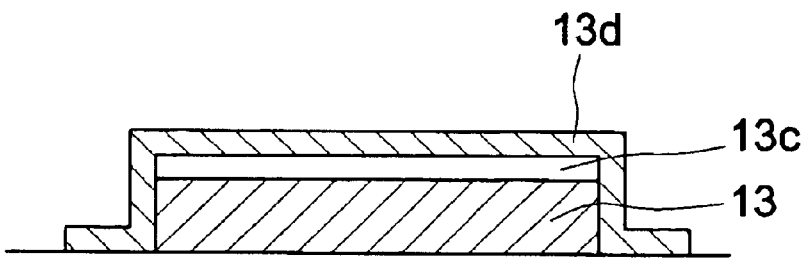

As shown in FIG. 6D, an insulating film intermediate layer 13d made of a material including one of silicon oxide such as SiO, aluminum oxide such as AlO, silicon nitride such as SiN, and aluminum nitride such as AlN may be formed on that portion of the intermediate layer 13c which will contact the glass frit 30. Since the above materials are superior in adhesiveness, the use one of the above materials provides even higher bonding strength than in the case of using only the intermediate layer 13c made of silver, copper, palladium, rhodium, nickel, cobalt, ruthenium, tungsten, molybdenum, titanium, or chromium.

Figure 16A:
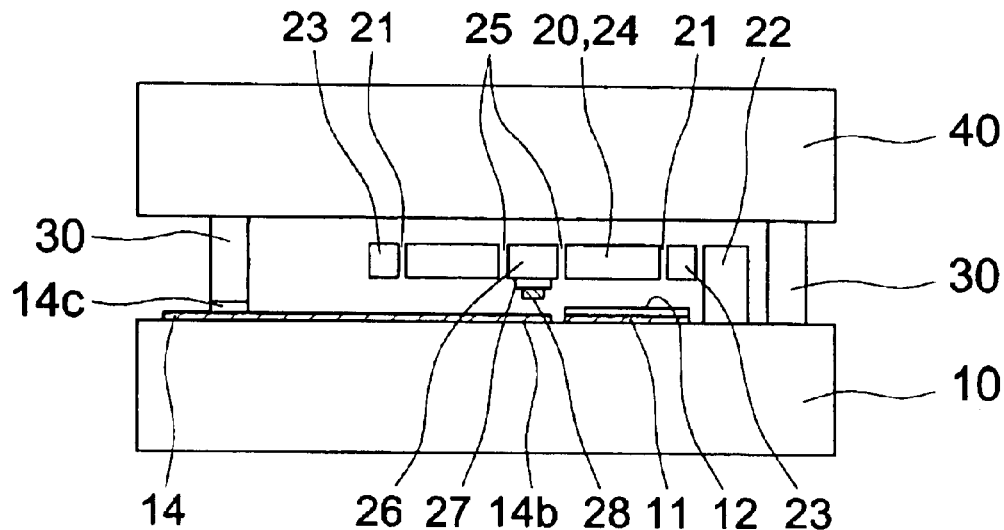
FIGS. 16A and 16B are sectional-view process diagrams taken along line B—B in FIG. 3 and showing a cap wafer joining method.
Figure 16B:
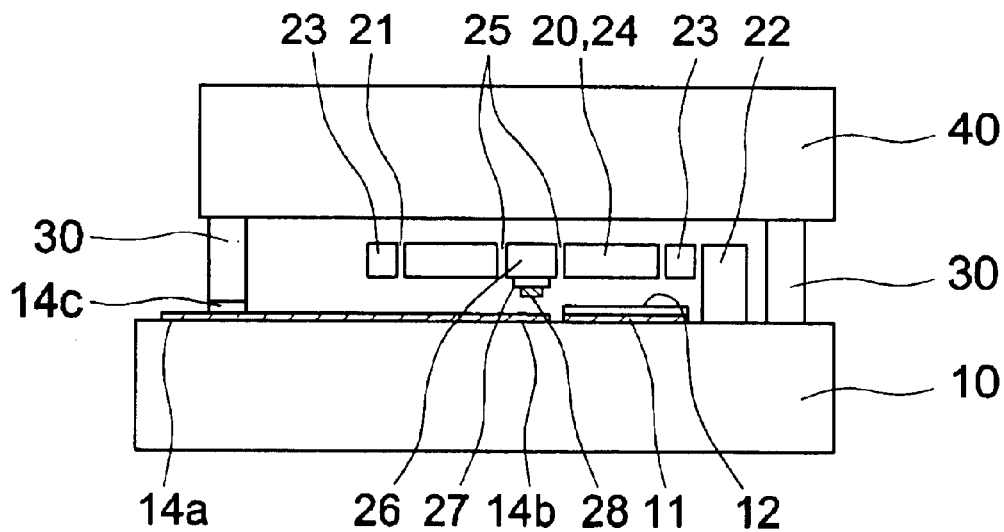

As shown in FIG. 3, the movable element 20 is such that a movable electrode 24 is supported via four support beams 23 extending from a planar, generally C-shaped anchor 22 so as to be driven in the thickness direction. The support beams 23 are formed by forming slits 21. In the movable electrode 24, a movable contact piece 26 is defined by two slits 25, 25 that are juxtaposed at the center of the movable electrode 24. A movable contact 28 is formed at the center on the bottom surface of the movable contact piece 26 with an insulating layer 27 interposed in between (FIGS. 16A and 16B). The movable contact 28 is opposed to the fixed contacts 14b and 15b so as to be able to contact and be detached from the fixed contacts 14b and 15b. In particular, where an insulating film intermediate layer 13d is formed by same material of an insulating film 12, an insulating film intermediate layer 13d can be formed simultaneously with an insulating film 12.

The movable element 20 is sealed in hermetically so as to be placed in the space formed by the base wafer 10, the cap wafer 40, and the glass frit 30.

Next, a manufacturing method of the microrelay according to the embodiment will be described. FIGS. 7A–7C to FIGS. 11A and 11B are sectional-view process diagrams taken along line A—A in FIG. 3 and FIGS. 12A–12C to FIGS. 16A and 16B are sectional-view process diagrams taken along line B—B in FIG. 3.

Figure 7A:
FIGS. 7A–7C are sectional-view process diagrams taken along line A—A in FIG. 3 and showing steps that are executed on a base wafer.
Figure 7B:
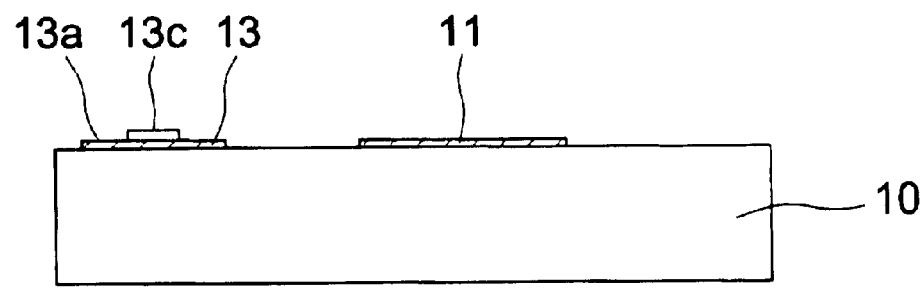
Figure 7C:
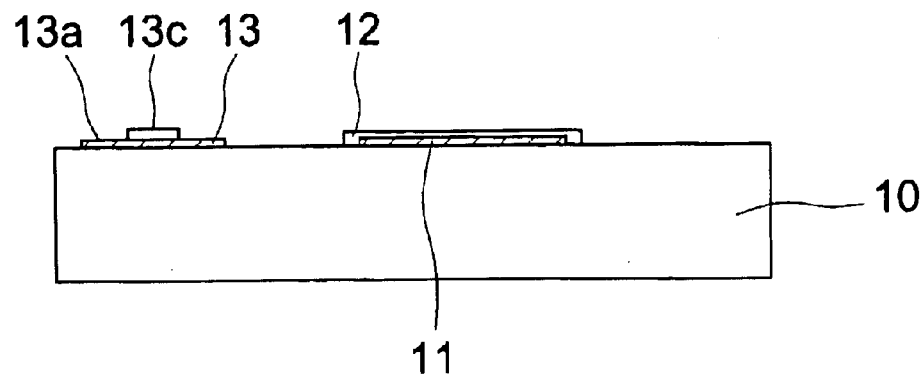
Figure 12A:
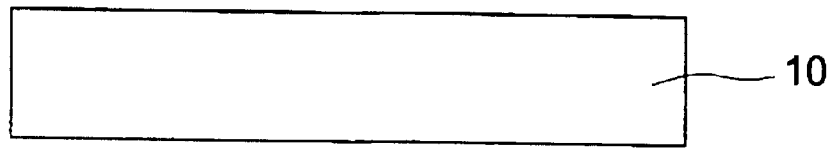
FIGS. 12A–12C are sectional-view process diagrams taken along line B—B in FIG. 3 and showing steps that are executed on the base wafer.
Figure 12B:
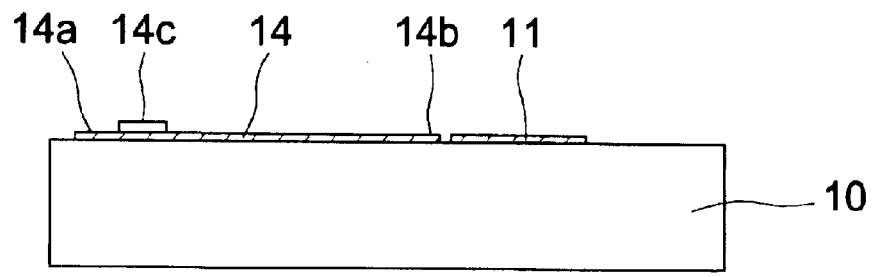
Figure 12C:
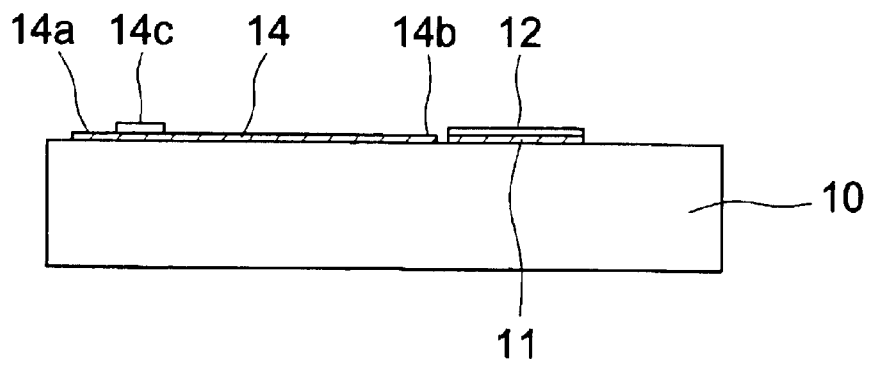

A planar, generally π-shaped electrode 11 and interconnections 13–16 are formed at prescribed positions on the top surface of a glass wafer 10 of Pyrex glass or the like shown in FIGS. 7A and 12A by sputtering, evaporation, plating, screen printing, or the like. Intermediate layers 13c–16c are formed on those portions of the respective interconnections 13–16 which are to be bonded to a glass frit 30 (see FIGS. 7B and 12B). On the other hand, the electrode 11 is covered with an insulating film 12 which is formed by sputtering, evaporation, plating, screen printing, or the like. (see FIGS. 7C and 12C).

Figure 8A:
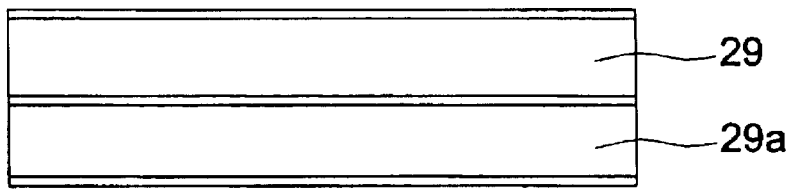
FIGS. 8A–8E are sectional-view process diagrams taken along line A—A in FIG. 3 and showing steps that are executed on an SOI wafer.
Figure 8B:
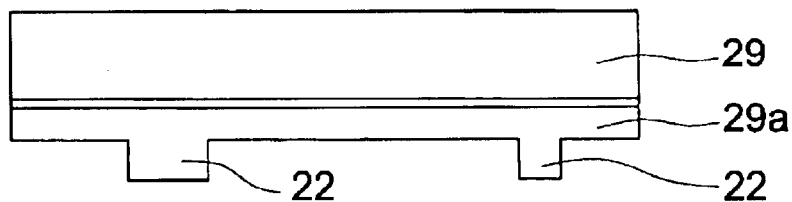
Figure 8C:
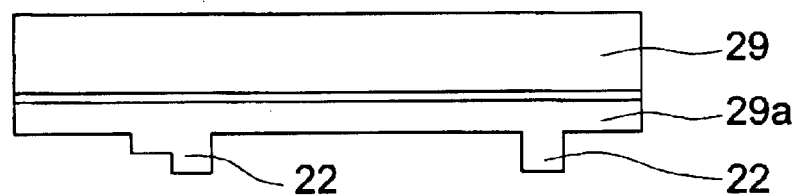
Figure 8D:
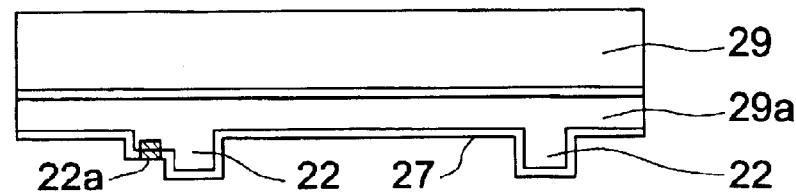
Figure 8E:
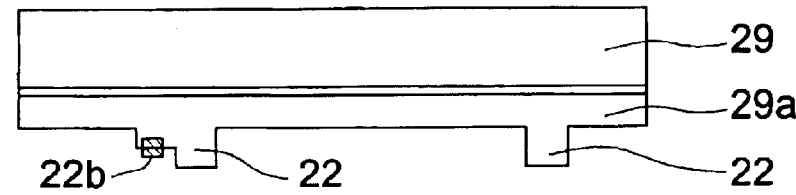
Figure 13A:
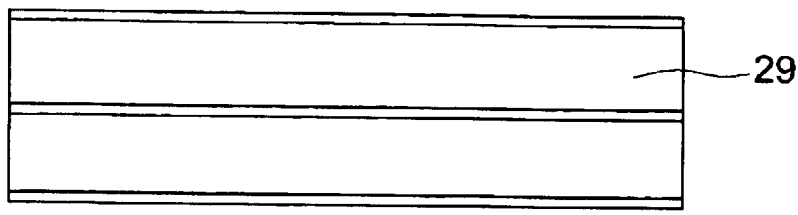
FIGS. 13A–13E are sectional-view process diagrams taken along line B—B in FIG. 3 and showing steps that are executed on the SOI wafer.
Figure 13B:
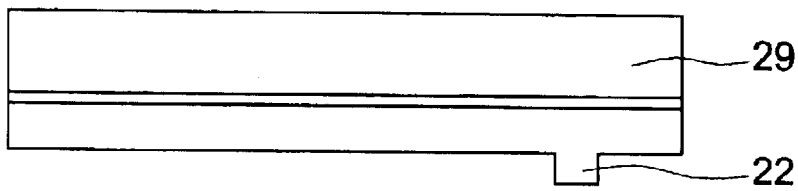
Figure 13C:
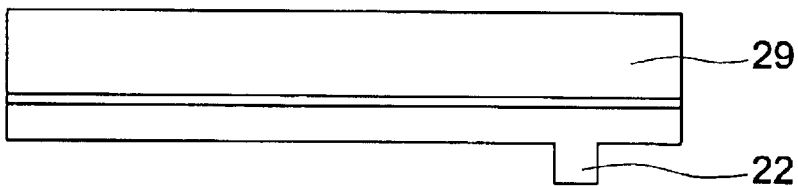
Figure 13D:
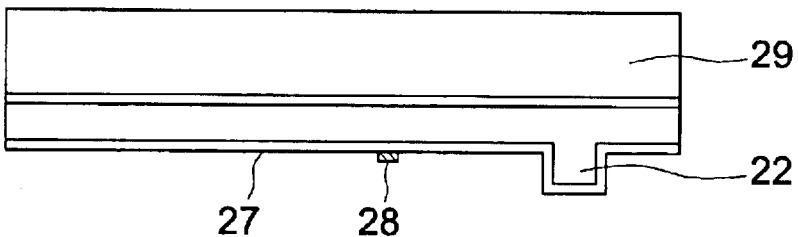
Figure 13E:
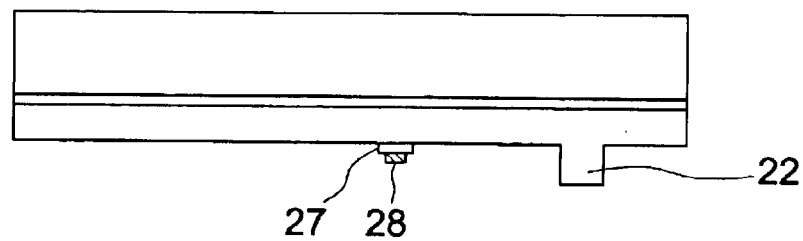

As shown in FIGS. 8A and 13A, an SOI (silicon-on-insulator) wafer 29 having a single crystal silicon wafer having crystal orientation (100) is prepared. To secure a desired support beam thickness and movable electrode thickness, an anchor 22 is formed by performing TMAH (alkaline etching liquid) etching on the surface of the SOI wafer 29 on the side of an active layer 29a (see FIGS. 8B and 13B). A step 22a is formed in a base portion of the anchor 22 in a similar manner by TMAH etching (see FIG. 8C). After an oxide film 27 is formed, a movable contact 28 and a relay connection portion 22b are formed by depositing a conductive material by sputtering, evaporation, plating, screen printing, or the like and patterning it (see FIGS. 8D and 13D). The oxide film 27 is removed except its portion located under the movable contact 28 (see FIGS. 8E and 12E).

Figure 9A:
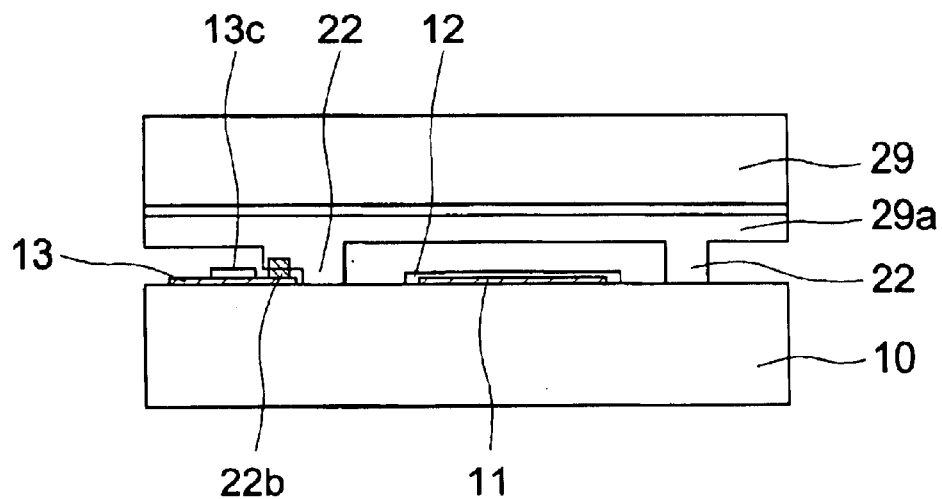
FIGS. 9A–9C are sectional-view process diagrams taken along line A—A in FIG. 3 and showing an SOI wafer joining method.
Figure 9B:
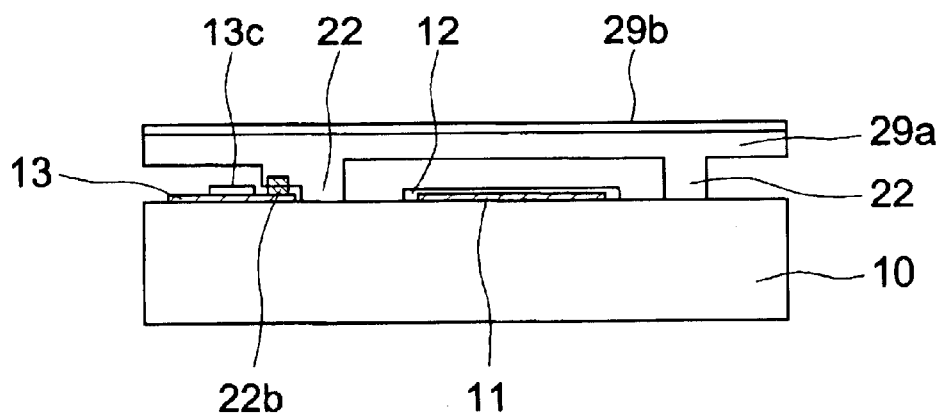
Figure 9C:
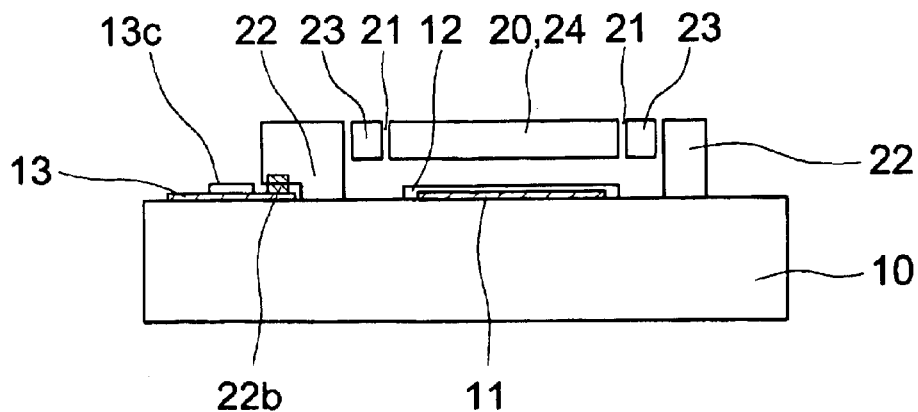
Figure 10A:
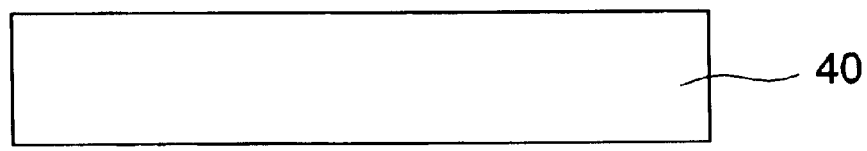
FIGS. 10A and 10B are sectional-view process diagrams taken along line A—A in FIG. 3 and showing steps that are executed on a cap wafer.
Figure 10B:
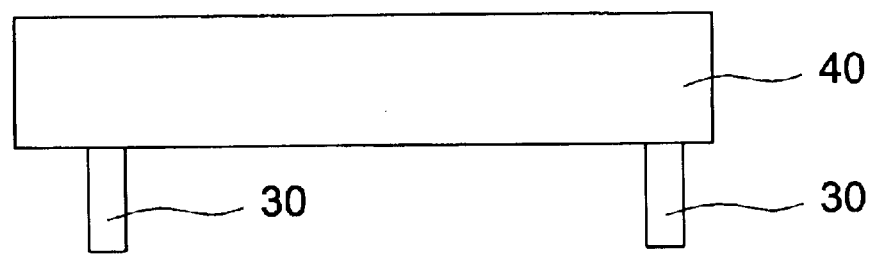
Figure 14A:
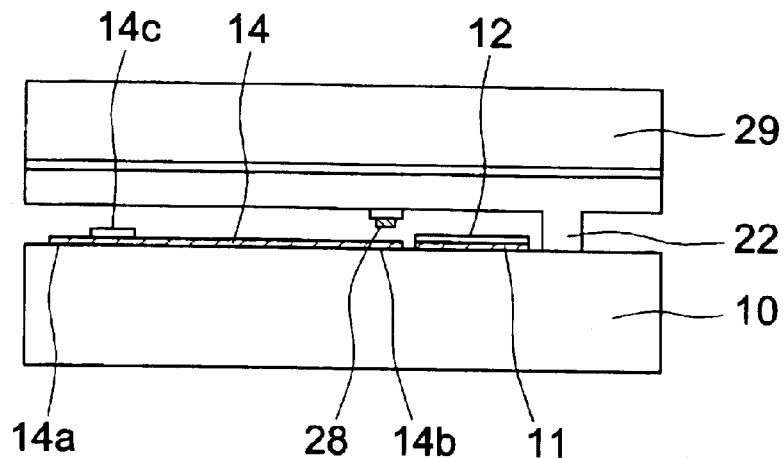
FIGS. 14A–14C are sectional-view process diagrams taken along line B—B in FIG. 3 and showing an SOI wafer joining method.
Figure 14B:
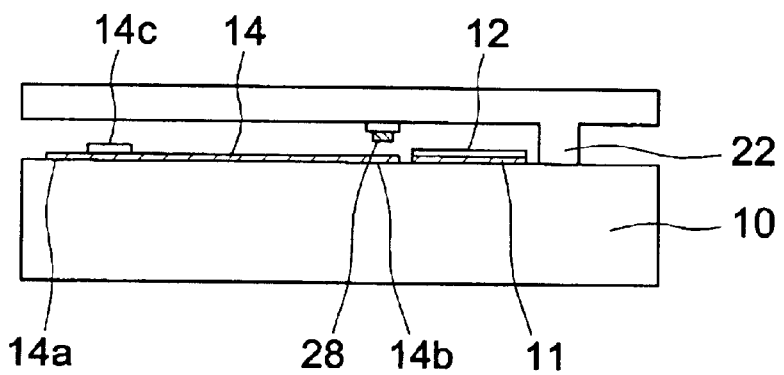
Figure 14C:
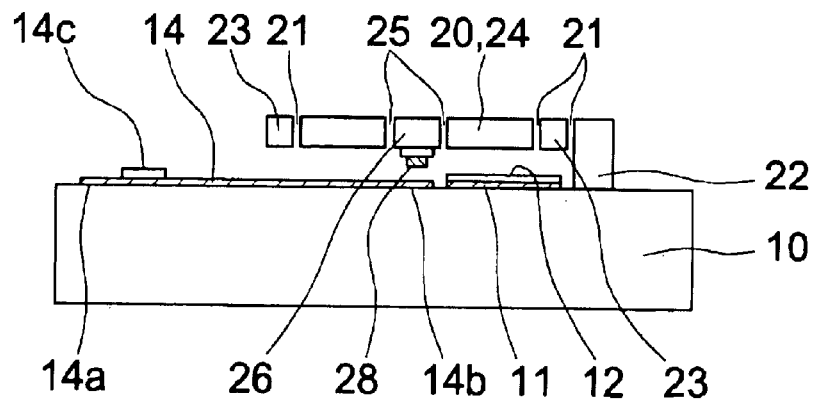
Figure 15A:
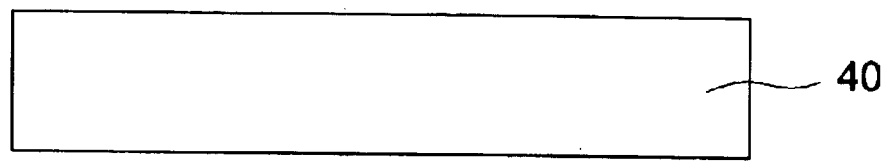
FIGS. 15A and 15B are sectional-view process diagrams taken along line B—B in FIG. 3 and showing steps that are executed on the cap wafer.
Figure 15B:
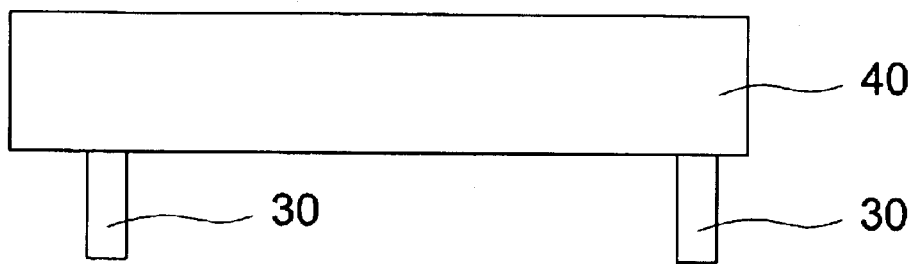

The SOI wafer 29 is positioned with respect to the base wafer 10 and positive electrode joining is performed (see FIGS. 9A and 14A). The SOI wafer 29 is subjected to thinning, that is, its top portion is removed with an alkaline etching liquid such as TMAH or KOH (see FIGS. 9B and 14B). The alkaline etching liquid has a much lower oxide film etching rate than a silicon etching rate. Therefore, the etching can be stopped at an oxide film 29b that is buried in the SOI wafer 29 and the SOI wafer 29 can be thinned with high thickness accuracy. The exposed oxide film 29b is removed with HF or the like (see FIG. 14B). Slits 21 and 25 are formed in the remaining active layer 29a of the SOI wafer 29 by dry etching, whereby a movable electrode 24 and a movable contact piece 26 are defined (see FIGS. 9C and 14C).

Figure 11A:
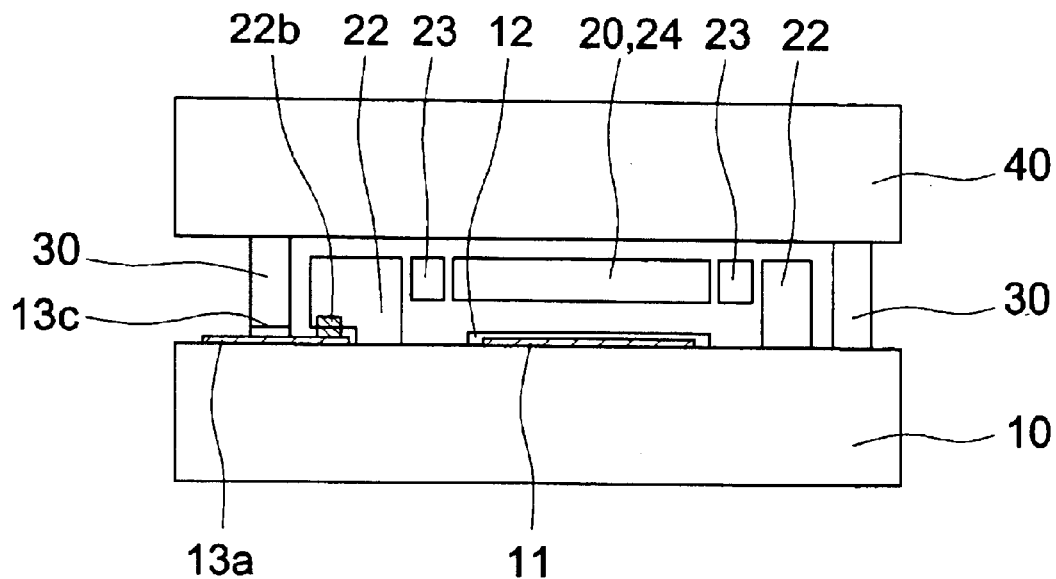
FIGS. 11A and 11B are sectional-view process diagrams taken along line A—A in FIG. 3 and showing a cap wafer joining method.
Figure 11B:
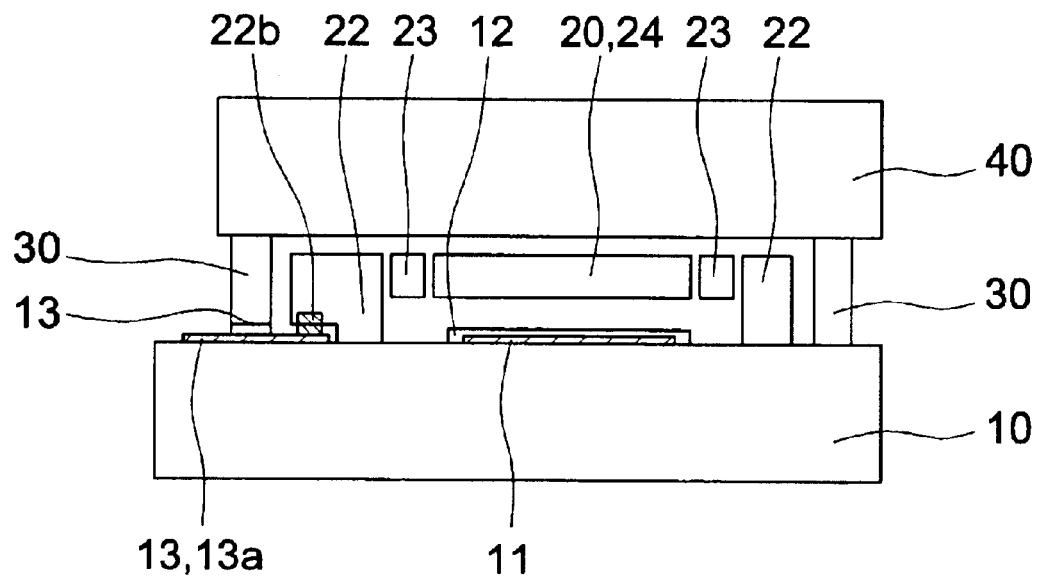

As shown in FIGS. 10A and 10B and FIGS. 15A and 15B, an annular glass frit 30 is formed, by screen printing, at a prescribed position on the bottom surface of a cap wafer 40 that is a glass wafer made of Pyrex glass or the like. As shown in FIGS. 11A and 16A, the cap wafer 40 is bonded to the base wafer 10 with the glass frit 30 interposed in between by heating and pressurization so that the cap wafer 40 and the base wafer 10 are integrated with each other. At this time, the glass frit 30 is placed on the interconnections 13–16 with the intermediate layers 13c–16c interposed in between. Therefore, the cap wafer 40 and the base wafer 10 can be bonded to each other with desired bonding strength. Then, that portion of the cap wafer 40 which covers the connection pads 13a–16a of the interconnections 13–16 is removed by dicing (see FIGS. 11B and 16B).

Next, the operation of the microrelay having the above-described configuration will be described. When no voltage is applied between the fixed electrode 11 and the movable electrode 24 from the connection pads 13a and 16a of the interconnections 13 and 16 and hence no electric field develops between the electrodes 11 and 24, the movable contact 28 is separated from the fixed contact portions 14b and 15b (see FIG. 16B).

When a voltage is applied between the fixed electrode 11 and the movable electrode 24 from the connection pads 13a and 16a of the interconnections 13 and 16, the movable electrode 24 is attracted by the fixed electrode 11 because of electrostatic force generated in between. As a result, the movable electrode 24 goes down in the thickness direction against the resilient force of the support beams 23. After the movable contact 28 contacts the fixed contact portions 14b and 15b, the movable electrode 24 is absorbed on the fixed electrode 11 with the insulating film 12 interposed in between.

Then, when the voltage application is terminated, the movable electrode 24 is returned to the original state by the resilient force of the support beams 23 and the movable contact 28 is separated from the fixed contact portions 14b and 15b and returned to the original state.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A semiconductor device comprising:
   a base wafer;
   a semiconductor element and interconnections formed on a top surface of the base wafer, the interconnections having respective lead lines;
   a glass frit;
   a cap wafer bonded to the top surface of the base wafer with the glass frit interposed in between so that the cap wafer and the base wafer are integrated with each other and the semiconductor element is sealed in hermetically;

single or multi-layer intermediate layers formed on at least top surfaces of portions of the respective lead lines on which the glass frit is placed, the intermediate layers having a property of easily adhering to the glass frit and the lead lines.

2. The semiconductor device according to claim 1, wherein each of the lead lines has a cross-section having a gentle top outline with no edge.

3. The semiconductor device according to claim 1, wherein the intermediate layers are thicker than the lead lines.

4. The semiconductor device according to claim 1, wherein the intermediate layers are wider than the lead lines.

5. The semiconductor device according to claim 1, wherein the intermediate layers are formed on only top surfaces of the respective lead lines.

6. The semiconductor device according to claim 1, wherein the intermediate layers are made of one of silver, copper, palladium, rhodium, nickel, cobalt, ruthenium, tungsten, molybdenum, titanium, and chromium.

7. The semiconductor device according to claim 1, wherein at least a portion of each of the intermediate layers that is in contact with the glass frit is made of an insulating material including one of silicon oxide, aluminum oxide, silicon nitride, and aluminum nitride.

8. The semiconductor device according to claim 1, wherein the intermediate layers have been subjected to oxidation.

9. The semiconductor device according to claim 1, wherein the semiconductor element is a movable element of a microrelay.

10. The semiconductor device according to claim 1, wherein contacts of the microrelay are made of the same material as the interconnections are.

11. A manufacturing method of a semiconductor device in which a semiconductor element is sealed in hermetically by bonding a cap wafer to a top surface of a base wafer on which the semiconductor element and interconnections are formed with a glass frit interposed in between so that the cap wafer and the base wafer are integrated with each other, comprising the step of:

forming single or multi-layer intermediate layers on at least top surfaces of portions of lead lines of the respective interconnections on which the glass frit is to be placed, the intermediate layers having a property of easily adhering to the glass frit and the lead lines.

12. A microrelay comprising:

a base wafer;

a movable element of the microrelay and interconnections formed on a top surface of the base wafer, the interconnections having respective lead lines;

a glass frit;

a cap wafer bonded to the top surface of the base wafer with the glass frit interposed in between so that the cap wafer and the base wafer are integrated with each other and the movable element is sealed in hermetically;

single or multi-layer intermediate layers formed on at least top surfaces of portions of the respective lead lines on which the glass frit is placed, the intermediate layers having a property of easily adhering to the glass frit and the lead lines.

13. A manufacturing method of a microrelay in which a movable element of the microrelay is sealed in hermetically by bonding a cap wafer to a top surface of a base wafer on which the movable element and interconnections are formed with a glass frit interposed in between so that the cap wafer and the base wafer are integrated with each other, comprising the step of:

forming single or multi-layer intermediate layers on at least top surfaces of portions of lead lines of the respective interconnections on which the glass frit is to be placed, the intermediate layers having a property of easily adhering to the glass frit and the lead lines.

* * * * *